United States Patent
Kusuda et al.

(10) Patent No.: US 7,062,161 B2
(45) Date of Patent: Jun. 13, 2006

(54) PHOTOIRRADIATION THERMAL PROCESSING APPARATUS AND THERMAL PROCESSING SUSCEPTOR EMPLOYED THEREFOR

(75) Inventors: Tatsufumi Kusuda, Kyoto (JP); Akihiro Hosokawa, Kyoto (JP); Hiromi Murayama, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/661,240

(22) Filed: Sep. 11, 2003

(65) Prior Publication Data

US 2004/0105670 A1   Jun. 3, 2004

(30) Foreign Application Priority Data

Nov. 28, 2002 (JP) .............. P2002-345854
Feb. 10, 2003 (JP) .............. P2003-032513

(51) Int. Cl.
*F26B 19/00* (2006.01)
(52) U.S. Cl. ............. 392/418; 392/416; 219/390; 219/405; 219/411; 118/724; 118/225; 118/50.1
(58) Field of Classification Search ............ 219/390, 219/405, 411; 392/416, 418; 118/724, 725, 118/50.1
See application file for complete search history.

(56) References Cited

U.S. PATENT DOCUMENTS

| | | | | |
|---|---|---|---|---|
| 4,571,486 A | * | 2/1986 | Arai et al. | 438/799 |
| 4,649,261 A | | 3/1987 | Sheets | 219/390 |
| 5,837,058 A | * | 11/1998 | Chen et al. | 118/728 |
| 6,026,589 A | | 2/2000 | Yao et al. | 34/78 |
| 6,167,194 A | * | 12/2000 | Moto et al. | 392/418 |
| 6,395,363 B1 | * | 5/2002 | Ballance et al. | 428/64.1 |
| 6,519,417 B1 | * | 2/2003 | Lee et al. | 392/418 |
| 6,594,446 B1 | * | 7/2003 | Camm et al. | 392/416 |

FOREIGN PATENT DOCUMENTS

| | | |
|---|---|---|
| JP | 57-162340 | 10/1982 |
| JP | 59-169125 | 9/1984 |
| JP | 60-258928 | 12/1985 |
| JP | 63-166219 | 7/1988 |
| JP | 10-074705 | 3/1998 |
| JP | 2000-355766 | 12/2000 |
| JP | 2001-237195 | 8/2001 |
| JP | 2002-502117 | 1/2002 |

(Continued)

OTHER PUBLICATIONS

Untranslated Korean Office Action issues Aug. 29, 2005 in Connection with corresponding Korean application No. 10-2003-0082856.

(Continued)

*Primary Examiner*—Shawntina Fuqua
(74) *Attorney, Agent, or Firm*—Ostrolenk, Faber, Gerb & Soffen, LLP

(57) ABSTRACT

A susceptor is formed with a cavity having a tapered surface and a receiving surface. The gradient α of the tapered surface with respect to the receiving surface is set to at least 5° and less than 30°, so that a semiconductor wafer received by the susceptor can be located on the receiving surface through the tapered surface while the semiconductor wafer can be protected against excess stress also when the surface of the wafer abruptly thermally expands due to flashlight irradiation and can be prevented from cracking in thermal processing. Thus provided are a thermal processing susceptor and a thermal processing apparatus capable of preventing a substrate from cracking in thermal processing.

17 Claims, 7 Drawing Sheets

FOREIGN PATENT DOCUMENTS

| | | |
|---|---|---|
| KR | 1999-84603 | 12/1999 |
| KR | 2000-12370 | 7/2000 |

OTHER PUBLICATIONS

English statement of Examiner's assertion in Aug. 29, 2005 Korean Office Action of the relevancy of Korean Application No. 1999-84603 to application no. 10-2003-0082856.

English statement of Examiner's assertion in Aug. 29, 2005 Korean Office Action of the relevancy of Korean Application No. 2000-12370 to application No. 10-2003-0082856.

* cited by examiner

F I G. 1
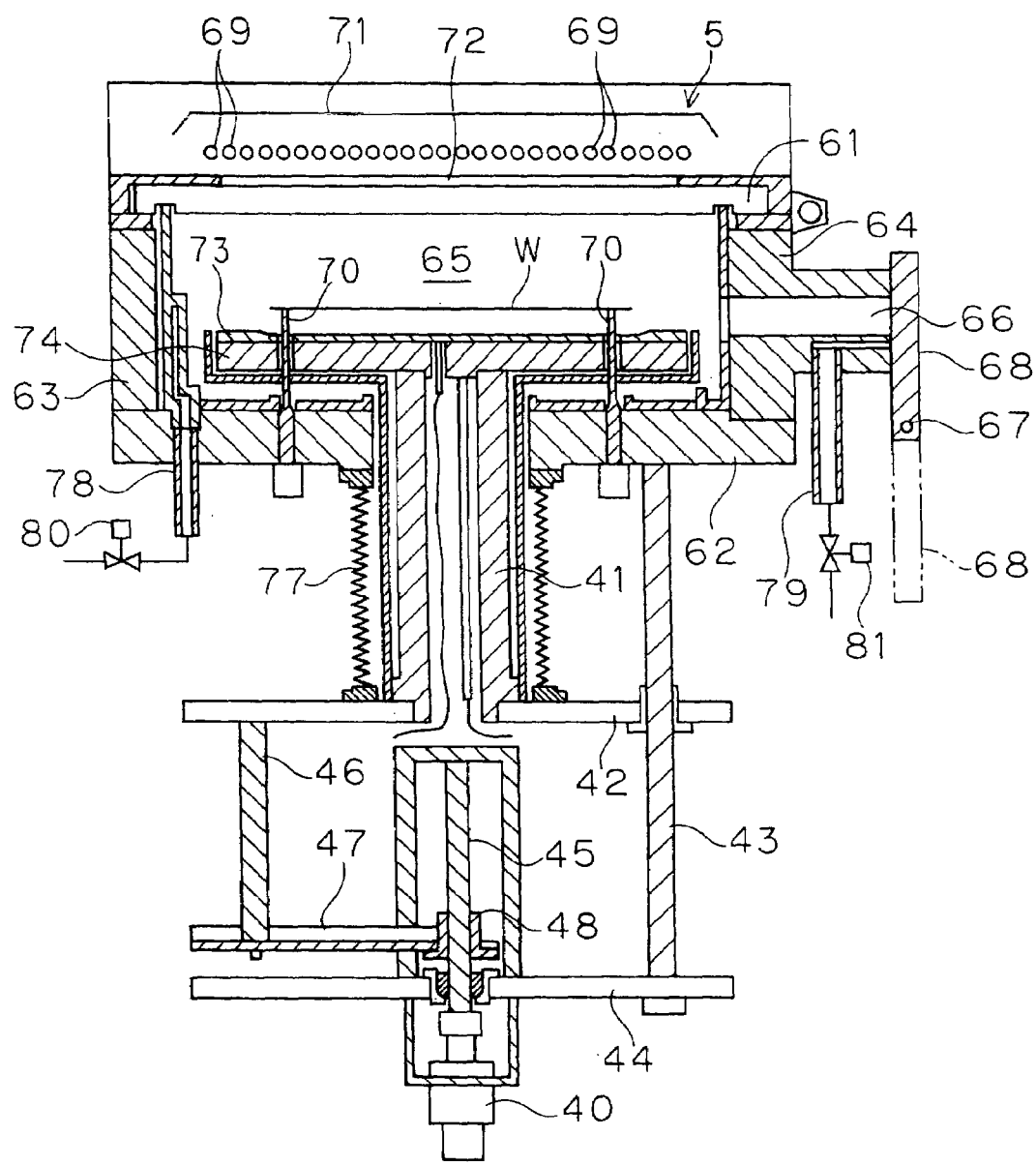

F I G. 5
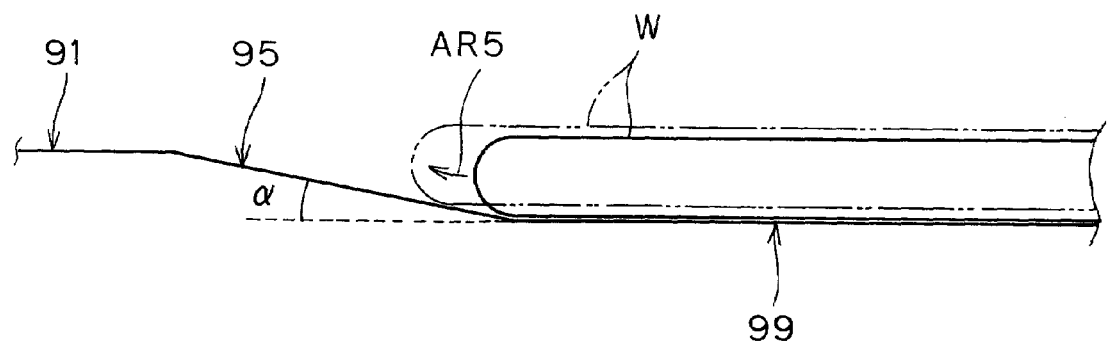

PHOTOIRRADIATION THERMAL PROCESSING APPARATUS AND THERMAL PROCESSING SUSCEPTOR EMPLOYED THEREFOR

BACKGROUND OF THE INVENTION

1. Field of the Invention

The present invention relates to a thermal processing susceptor holding a semiconductor wafer or a glass substrate (hereinafter simply referred to as "substrate") thermally processed by photoirradiation and a thermal processing apparatus comprising this thermal processing susceptor.

2. Description of the Background Art

In general, a thermal processing apparatus such as a lamp annealing apparatus using halogen lamps is employed in an ion activation step for an ion-implanted semiconductor wafer. This thermal processing apparatus heats (anneals) the semiconductor wafer to a temperature of about 1000° C. to 1100° C., for example, thereby activating ions implanted into the semiconductor wafer. The thermal processing apparatus increases the temperature of a substrate at a rate of about several 100 degrees per second through the energy of light emitted from the halogen lamps.

However, it has been proved that the profile of the ions implanted into the semiconductor wafer is rounded, i.e., the ions are thermally diffused when the thermal processing apparatus increasing the temperature of the substrate at the rate of about several 100 degrees per second is employed for activating the ions implanted into the semiconductor wafer. In this case, ions must disadvantageously be implanted into the surface of the semiconductor wafer beyond necessity since the ions are diffused also when the same are implanted in high concentration.

In order to solve the aforementioned problem, Japanese Patent Application Laying-Open Gazette No. 59-169125 (1984) or 63-166219 (1988), for example, proposes a technique of irradiating the surface of an ion-implanted semiconductor wafer with flashlight through a xenon flash lamp or the like thereby increasing the temperature of only the surface of the semiconductor wafer in an extremely short time of not more than several ms. When the semiconductor wafer is heated with a xenon flash lamp in an extremely short time, there is no sufficient time for diffusing the ions and hence only ion activation can be carried out without rounding the profile of the ions implanted into the semiconductor wafer.

A conventional thermal processing apparatus, not necessarily employing a photoirradiation heating system, generally performs thermal processing while holding a substrate with a susceptor having excellent heat resistance, as proposed in Japanese Patent Application Laying-Open Gazette No. 10-74705 (1998) or 2000-355766, for example.

A xenon flash lamp instantaneously applies light having extremely high energy to a semiconductor wafer, and hence the surface temperature of the semiconductor wafer is abruptly increased in an instant. If the energy of the applied light exceeds a certain threshold in this case, it follows that the semiconductor wafer is cracked in a high probability due to abrupt thermal expansion of the surface. In practice, therefore, the xenon flash lamp emits light at an energy level less than the aforementioned threshold with a certain degree of allowance (process margin).

When the thermal processing apparatus heats a wafer with flashlight emitted from the xenon flash lamp while holding the semiconductor wafer with the susceptor, however, the semiconductor wafer may be cracked also when the energy level of the flashlight is less than the aforementioned threshold. If an end of the wafer is in contact with a pocket edge or a positioning pin of the susceptor when the surface of the wafer is abruptly thermally expanded due to the instantaneously applied flashlight to convexly warp the semiconductor wafer, large stress is applied to the contact portion while the wafer has no temporal allowance for slidingly moving on the susceptor in order to relax such stress. Consequently, the semiconductor wafer is cracked by the stress upon instantaneous thermal expansion if the end thereof is in contact with something, also when the applied flashlight has an energy level less than the aforementioned threshold.

SUMMARY OF THE INVENTION

The present invention is directed to a thermal processing susceptor holding a substrate subjected to thermal processing.

According to the present invention, the thermal processing susceptor comprises a flat receiving surface having a region larger than the planar size of the substrate and a tapered surface annularly enclosing the peripheral edge of the receiving surface for specifying the receiving surface, while the lower end of the tapered surface is concatenated to the peripheral edge of the receiving surface, the tapered surface is formed to upwardly broaden and the gradient of the tapered surface with respect to the receiving surface is at least 5° and less than 30°.

The substrate can be properly positioned on the receiving surface, and can be inhibited from action of excess stress also when the surface thereof abruptly thermally expands in the thermal processing, to be prevented from cracking.

According to an aspect of the present invention, the thermal processing susceptor comprises a flat receiving surface having a region larger than the planar size of the substrate, a first tapered surface annularly enclosing the peripheral edge of the receiving surface for specifying the receiving surface and a second tapered surface annularly enclosing the peripheral edge of the first tapered surface, while the lower end of the first tapered surface is concatenated to the peripheral edge of the receiving surface, the lower end of the second tapered surface is concatenated to the upper end of the first tapered surface, the first tapered surface is formed to upwardly broaden, an opening specified by the upper end of the second tapered surface is rendered wider than the receiving surface, and the gradient of the second tapered surface with respect to the receiving surface is rendered larger than the gradient of the first tapered surface.

The substrate can be inhibited from action of excess stress also when the surface thereof abruptly thermally expands in the thermal processing to be prevented from cracking, and can also be prevented from jumping out of the thermal processing susceptor.

According to another aspect of the present invention, the thermal processing susceptor comprises a flat receiving surface having a region larger than the planar size of the substrate and a tapered surface annularly enclosing the peripheral edge of the receiving surface for specifying the receiving surface, while the lower end of the tapered surface is concatenated to the peripheral edge of the receiving surface, the tapered surface is formed to upwardly broaden, and the tapered surface has such a gradient that an end of the substrate slides up along the tapered surface when the substrate thermally expands while the end is in contact with the tapered surface.

Also when the surface of the substrate abruptly thermally expands in the thermal processing, the substrate can be inhibited from action of excess stress and prevented from cracking.

The present invention is also directed to a thermal processing apparatus irradiating the substrate held in the aforementioned thermal processing susceptor with light thereby heating the substrate.

Accordingly, an object of the present invention is to provide a thermal processing susceptor and a thermal processing apparatus capable of preventing a substrate from cracking in thermal processing.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1 and 2 are side sectional views showing the structure of a thermal processing apparatus according to a first embodiment of the present invention;

FIG. 5 illustrates the behavior of a semiconductor wafer irradiated with flashlight in the first embodiment;

DESCRIPTION OF THE PREFERRED EMBODIMENTS

Embodiments of the present invention are now described in detail with reference to the accompanying drawings.

<1. First Embodiment>

Figure 2:
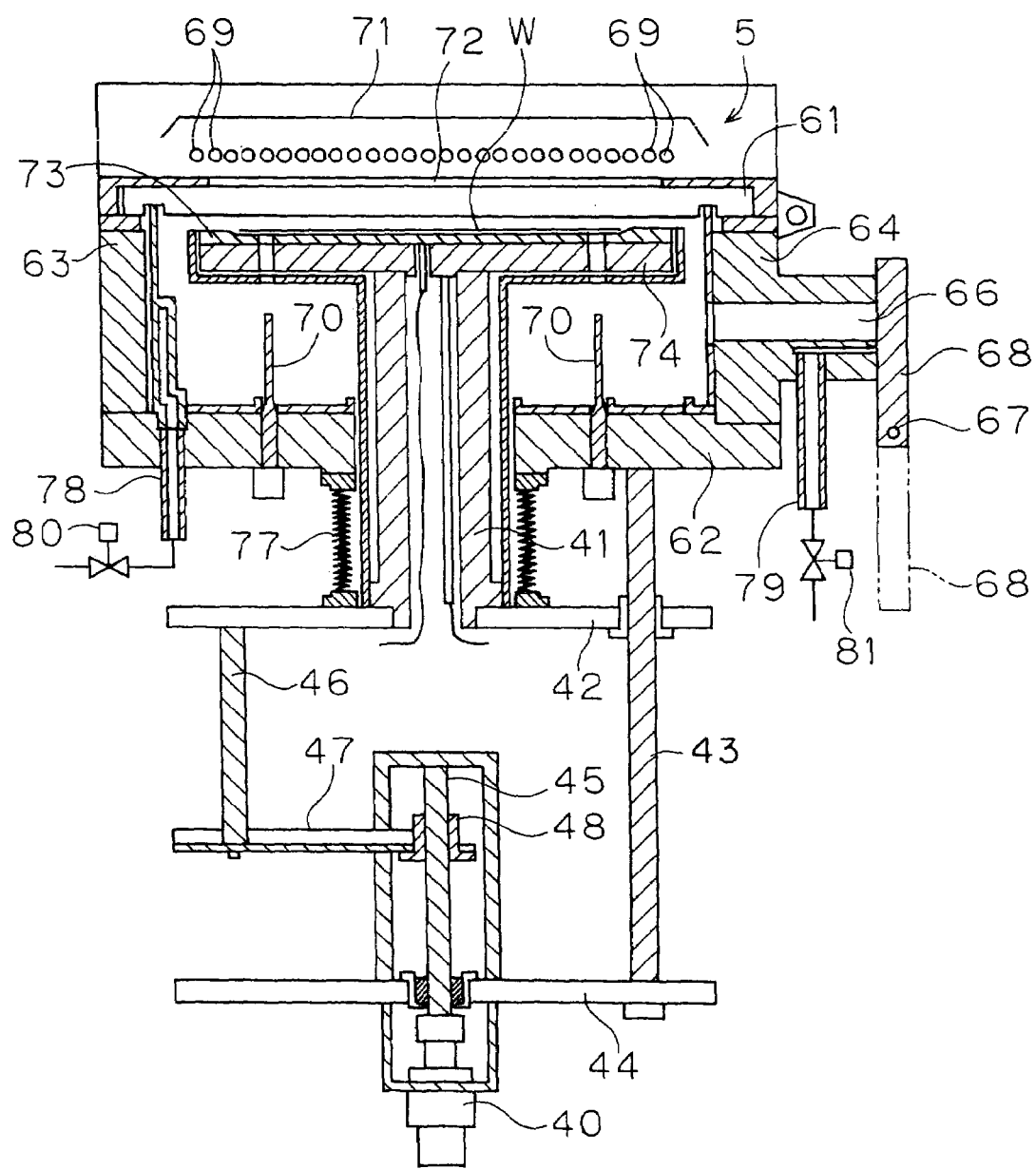

FIGS. 1 and 2 are side sectional views showing the structure of a thermal processing apparatus according to a first embodiment of the present invention. This thermal processing apparatus thermally processes a substrate such as a circular semiconductor wafer W with flashlight emitted from xenon flash lamps 69.

The thermal processing apparatus comprises a chamber 65 consisting of a translucent plate 61, a bottom plate 62 and a pair of side plates 63 and 64. The thermal processing apparatus thermally processes the semiconductor wafer W stored in the chamber 65. The translucent plate 61 forming the upper portion of the chamber 65 is constituted of an infrared-translucent material such as quartz, for example, for serving as a chamber window transmitting light emitted from a light source 5 and guiding the same into the chamber 65. Support pins 70 passing through a susceptor 73 and a heating plate 74 described later for supporting the semiconductor wafer W from under the lower surface thereof are uprightly provided on the bottom plate 62 forming the chamber 65.

The side plate 64 constituting the chamber 65 is formed with an opening 66 for introducing and discharging the semiconductor wafer W into and from the chamber 65. The opening 66 is openable/closable through a gate valve 68 rotating about a shaft 67. A transport robot (not shown) introduces the semiconductor wafer W into the chamber 65 when the opening 66 is opened. The gate valve 68 closes the opening 66 when the thermal processing apparatus thermally processes the semiconductor wafer W in the chamber 65.

The chamber 65 is provided under the light source 5. The light source 5 comprises a plurality of (27 in this embodiment) xenon flash lamps 69 (hereinafter also simply referred to as "flash lamps 69") and a reflector 71. The plurality of flash lamps 69, which are long cylindrical bar lamps respectively, are provided in parallel with each other longitudinally along the horizontal direction. The reflector 71 is provided above the plurality of flash lamps 69 to cover the overall flash lamps 69.

Each xenon flash lamp 69 comprises a glass tube filled with xenon gas and provided on both ends thereof with an anode and a cathode connected to a capacitor and a trigger electrode wound on the outer periphery of the glass tube. In an ordinary state, no electricity flows in the glass tube filled with the xenon gas which is electrically an insulator. When a high voltage is applied to the trigger electrode for breaking down the insulation, however, electricity stored in the capacitor instantaneously flows into the glass tube for heating the xenon gas with Joule heat and emitting light. The xenon flash lamps 69, converting previously stored electrostatic energy to extremely short optical pulses of 0.1 ms to 10 ms, can emit extremely intense light as compared with a continuous light source.

A light diffusion plate 72 is arranged between the light source 5 and the translucent plate 61. This light diffusion plate 72 is formed by performing light diffusion working on the surface of a plate of quartz glass employed as an infrared-translucent material.

Part of the light emitted from the flash lamps 69 is directly transmitted through the light diffusion plate 72 and the translucent plate 61 and directed into the chamber 65. Another part of the light emitted from the flash lamps 69 is temporarily reflected by the reflector 71, thereafter transmitted through the light diffusion plate 72 and the translucent plate 61, and directed into the chamber 65.

The heating plate 74 and the susceptor 73 are provided in the chamber 65. The susceptor 73 is bonded to the upper surface of the heating plate 74. The heating plate 74 and the susceptor 73 constitute a holding element substantially horizontally holding the semiconductor wafer W in the chamber 65.

The heating plate 74 is employed for preheating (assist-heating) the semiconductor wafer W. This heating plate 74 is made of aluminum nitride, and stores a heater and a sensor for controlling the heater. On the other hand, the susceptor 73 is employed for positioning and holding the semiconductor wafer W while homogeneously preheating the semiconductor wafer W by diffusing thermal energy received from the heating plate 74. A material such as aluminum nitride or quartz having relatively small thermal conductivity is employed for the susceptor 73. The susceptor 73 is further described later in more detail.

A motor 40 drives the susceptor 73 and the heating plate 74 for vertically moving the same between a position for introducing/discharging the semiconductor wafer W into/from the chamber 65 shown in FIG. 1 and a position for thermally processing the semiconductor wafer W shown in FIG. 2.

The heating plate 74 is coupled to a movable plate 42 through a cylindrical body 41. This movable plate 42 is vertically movable through a guide member 43 suspended from the bottom plate 62 of the chamber 65. A fixed plate 44 is fixed to the lower end of the guide member 43, and the motor 40 rotating/driving a ball screw 45 is arranged on the central portion of the fixed plate 44. The ball screw 45 is fitted into a nut 48 coupled with the movable plate 42 through coupling members 46 and 47. Therefore, the motor 40 can drive the susceptor 73 and the heating plate 74 for vertically moving the same between the position for introducing/discharging the semiconductor wafer W into/from the chamber 65 shown in FIG. 1 and the position for thermally processing the semiconductor wafer W shown in FIG. 2.

The susceptor 73 and the heating plate 74 are moved down to the position for introducing/discharging the semiconductor wafer W into/from the chamber 65 shown in FIG. 1 so that the transport robot (not shown) can place the semiconductor wafer W introduced into the chamber 65 through the opening 66 on the support pins 70 or discharge the semiconductor wafer W placed on the support pins 70 from the chamber 65 through the opening 66. In this state, the upper ends of the support pins 70 pass through through-holes formed in the susceptor 73 and the heating plate 74, to upwardly project beyond the surface of the susceptor 73.

On the other hand, the susceptor 73 and the heating plate 74 are moved up beyond the upper ends of the support pins 70 on the position for thermally processing the semiconductor wafer W shown in FIG. 2, in order to thermally process the semiconductor wafer W. In the process of the upward movement of the susceptor 73 and the heating plate 74 from the position for introducing/discharging the semiconductor wafer W into/from the chamber 65 shown in FIG. 1 to the position for thermally processing the semiconductor wafer W shown in FIG. 2, the susceptor 73 receives the semiconductor wafer W placed on the support pins 70, moves up the semiconductor wafer W while supporting the lower surface thereof with its surface and horizontally holds the same on a position approximate to the translucent plate 61 in the chamber 65. In the process of the downward movement of the susceptor 73 and the heating plate 74 from the position for thermally processing the semiconductor wafer W to the position for introducing/discharging the semiconductor wafer W into/from the chamber 65, the susceptor 73 transfers the semiconductor wafer W supported thereon to the support pins 70.

When the susceptor 73 and the heating plate 74 supporting the semiconductor wafer W are moved up to the position for thermally processing the semiconductor wafer W, it follows that the translucent plate 61 is positioned between the semiconductor wafer W held by the same and the light source 5. The current distance between the susceptor 73 and the light source 5 can be adjusted to an arbitrary value by controlling the quantity of rotation of the motor 40.

An elastic bellows 77 is arranged between the bottom plate 62 of the chamber 65 and the movable plate 42 for maintaining the chamber 65 airtight by enclosing the cylindrical body 41. The bellows 77 contracts when the susceptor 73 and the heating plate 74 are moved up to the position for thermally processing the semiconductor wafer W, while the former expands when the latter are moved down to the position for introducing/discharging the semiconductor wafer W into/from the chamber 65 for disconnecting the internal atmosphere of the chamber 65 from the external atmosphere.

An introduction passage 78 communicatively connected to an on-off valve 80 is formed on the side plate 63 of the chamber 65 opposite to the opening 66. This introduction passage 78 is employed for introducing gas such as inert nitrogen gas into the chamber 65, for example, necessary for the processing. On the other hand, the opening 66 of the side plate 64 is formed with a discharge passage 79 communicatively connected to another on-off valve 81. This discharge passage 79, employed for discharging the gas from the chamber 65, is connected to an exhaust element (not shown) through the on-off valve 81.

Figure 3:
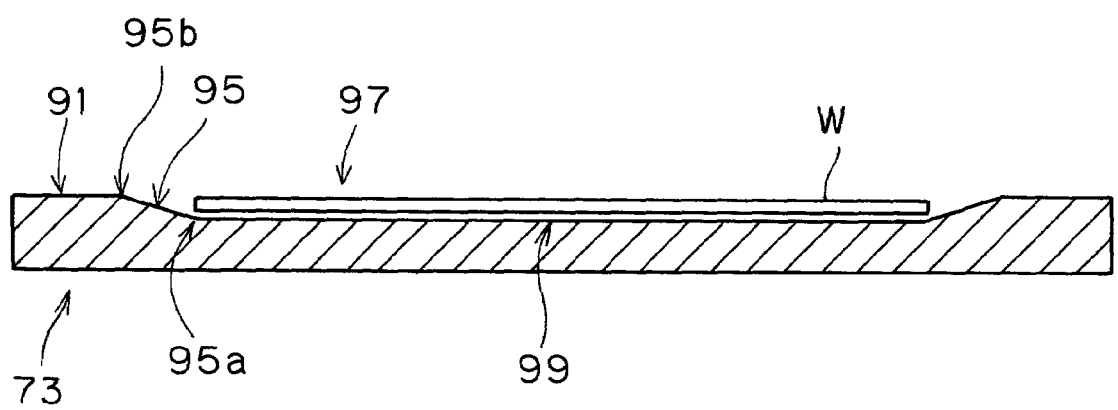
FIG. 3 is a side sectional view of a susceptor of the thermal processing apparatus according to the first embodiment.
Figure 4:
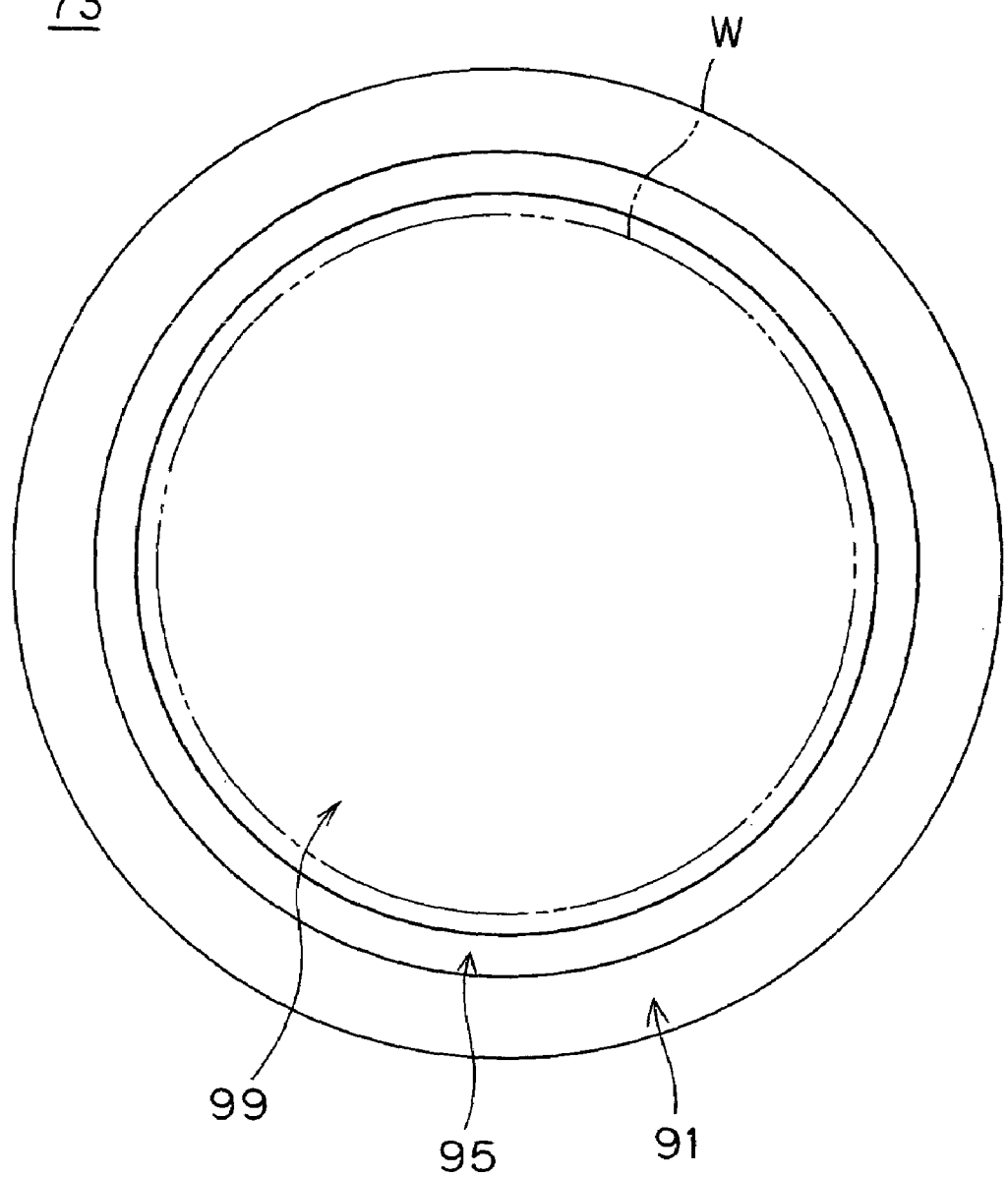
FIG. 4 is a plan view of the susceptor of the thermal processing apparatus according to the first embodiment.

The susceptor 73 is further described. FIGS. 3 and 4 are a side sectional view and a plan view of the susceptor 73 according to the first embodiment respectively. According to the first embodiment, the susceptor 73 is structured by forming a cavity 97 having a circular form as viewed above on a discoidal member. This cavity 97 functions for positioning the semiconductor wafer W and holding the same on the susceptor 73.

The bottom surface of the cavity 97 defines a receiving surface 99 of the susceptor 73. The receiving surface 99 is a circular plane having a diameter slightly larger than that of the semiconductor wafer W, i.e., a region larger than the planar size of the semiconductor wafer W. A tapered surface 95 is formed to annularly enclose the peripheral edge of the receiving surface 99 defined by the bottom surface of the cavity 97. The tapered surface 95 also serves as an inclined surface for defining the cavity 97. The tapered surface 95 has a lower end 95*a* concatenated to the peripheral edge of the receiving surface 99. From another point of view, it follows that the tapered surface 95 specifies the receiving surface 99.

The tapered surface 95 also has an upper end 95*b* concatenated to the peripheral edge surface 91 of the susceptor 73. The peripheral edge surface 91 is an annular plane parallel to the receiving surface 99. The inner diameter of the peripheral edge surface 91 is larger than the diameter of the receiving surface 99. In other words, the tapered surface 95 is formed to upwardly broaden.

The tapered surface 95 also serving as an inclined surface for defining the cavity 97 has a gradient α of at least 5° and less than 30° with respect to the receiving surface 99, and this gradient α may be set to 15°, for example (see FIG. 5). The average surface roughness (Ra) of the tapered surface 95 is set to not more than 1.6 μm.

The thermal processing operations of the thermal processing apparatus according to the first embodiment for the semiconductor wafer W are now described. This thermal processing apparatus processes the semiconductor wafer W completely subjected to ion implantation.

The thermal processing apparatus arranges the susceptor 73 and the heating plate 74 on the position for introducing/discharging the semiconductor wafer W into/from the chamber 65 shown in FIG. 1 so that the transport robot (not shown) introduces the semiconductor wafer W into the chamber 65 through the opening 66 and places the same on the support pins 70. When the transport robot completely introduces the semiconductor wafer W into the chamber 65, the gate valve 68 closes the opening 66. Thereafter the motor 40 drives the susceptor 73 and the heating plate 74 and moves up the same to the position for thermally processing the semiconductor wafer W shown in FIG. 2, for horizontally holding the semiconductor wafer W. The thermal processing apparatus opens the on-off valves 80 and 81 for forming a flow of nitrogen gas in the chamber 65.

In the process of the upward movement of the susceptor 73 and the heating plate 74, it follows that the susceptor 73 receives the semiconductor wafer W placed on the support pins 70. At this time, a thin air space is defined between the susceptor 73 and the semiconductor wafer W for several seconds after the susceptor 73 receives the semiconductor wafer W from the support pins 70, to slightly float up the semiconductor wafer W from the susceptor 73. In this case, such a phenomenon is repeated for several seconds that the semiconductor wafer W slidingly moves in the cavity 97 due to some cause (e.g., slight inclination) and the tapered surface 95 springs back an end of the semiconductor wafer W.

Thereafter the aforementioned air space disappears, whereby it follows that the susceptor 73 stably holds the semiconductor wafer W in its cavity 97. In other words, the tapered surface 95 positions the slightly floating semiconductor wafer W, and it follows that the susceptor 73 holds the semiconductor wafer W on the lowermost position of the cavity 97, i.e., the receiving surface 99 without a specific positioning pin or the like. The susceptor 73 eccentrically positions/holds the semiconductor wafer W on the receiving surface 99 in general, and hence it follows that the semiconductor wafer W is stably held while a point of its peripheral edge is in contact with the tapered surface 95.

The heater stored in the heating plate 74 previously heats the susceptor 73 and the heating plate 74 to a prescribed temperature. When the susceptor 73 and the heating plate 74 are moved up to the position for thermally processing the semiconductor wafer W, therefore, the heated susceptor 73 comes into contact with the semiconductor wafer W thereby preheating the same and gradually increasing the temperature thereof.

In this state, the susceptor 73 continuously heats the semiconductor wafer W.

When the temperature of the semiconductor wafer W is increased, a temperature sensor (not shown) regularly monitors whether or not the surface of the semiconductor wafer W has reached a preheating temperature T1.

The preheating temperature T1 is about 200° C. to 600° C. Ions implanted into the semiconductor wafer W are not diffused also when the semiconductor wafer W is heated to this degree of preheating temperature T1.

When the surface of the semiconductor wafer W reaches the preheating temperature T1, the thermal processing apparatus lights the flash lamps 69 for flash heating. In this flash heating step, the thermal processing apparatus lights the flash lamps 69 for about 0.1 ms to 10 ms. Thus, the flash lamps 69 convert previously stored electrostatic energy to such extremely short optical pulses, whereby it follows that the flash lamps 69 emit extremely intense flashlight.

The surface of the semiconductor wafer W instantaneously reaches a processing temperature T2 due to such flash heating. This processing temperature T2 of about 1000° C. to 1100° C. is necessary for activating the ions in the semiconductor wafer W. The substrate processing apparatus heats the surface of the semiconductor wafer W to this processing temperature T2, thereby activating the ions implanted into the semiconductor wafer W.

At this time, the thermal processing apparatus heats the surface of the semiconductor wafer W to the processing temperature T2 in an extremely short time of about 0.1 ms to 10 ms, thereby activating the ions in the semiconductor wafer W in a short time. Therefore, the ions implanted into the semiconductor wafer W are not diffused but the profile thereof can be prevented from rounding. The thermal processing apparatus requires an extremely short time for activating the ions as compared with that necessary for diffusing the ions, thereby completing the ion activation in the short time of about 0.1 ms to 10 ms causing no diffusion.

The thermal processing apparatus heats the surface of the semiconductor wafer W to the preheating temperature T1 of about 200° C. to 600° C. with the heating plate 74 before lighting the flash lamps 69 for heating the semiconductor wafer W, whereby the flash lamps 69 can quickly heat the semiconductor wafer W to the processing temperature T2 of about 1000° C. to 1100° C.

After completion of the flash heating step, the motor 40 drives the susceptor 73 and the heating plate 74 to move down the same to the position for introducing/discharging the semiconductor wafer W into/from the chamber 65 shown in FIG. 1 while the thermal processing apparatus releases the opening 66 having been closed with the gate valve 68. The susceptor 73 moved down with the heating plate 74 transfers the semiconductor wafer W to the support pins 70. The transport robot (not shown) discharges the semiconductor wafer W placed on the support pins 70 from the chamber 65. Thus, the thermal processing apparatus completes a series of thermal processing operations.

When the thermal processing apparatus lights the flash lamps 69 for heating the semiconductor wafer W, the surface of the semiconductor wafer W abruptly expands due to instantaneous flashlight irradiation to convexly warp the semiconductor wafer W. If an end of the semiconductor wafer W is in contact with a positioning pin or the like, the semiconductor wafer W may be cracked by stress received from the contact position upon instantaneous thermal expansion, as described above.

According to this embodiment, the gradient α of the tapered surface 95 with respect to the receiving surface 99 is set to 15°. As hereinabove described, the semiconductor wafer W is generally stably held while a point of its peripheral edge is in contact with the tapered surface 95. When the gradient α of the tapered surface 95 is less than 30°, the end of the semiconductor wafer W in contact with the tapered surface 95 can slide with respect to the tapered surface 95 also when the semiconductor wafer W instantaneously thermally expands, as shown by arrow AR5 in FIG. 5. In other words, the gradient α of the tapered surface 95 is set to less than 30° so that the tapered surface 95 does not constrain the end of the semiconductor wafer W, whereby the semiconductor wafer W can freely expand upon lighting of the flash lamps 69. Consequently, the tapered surface 95 applies no large stress to the semiconductor wafer W also when the surface thereof abruptly thermally expands due to instantaneous flashlight irradiation, whereby the semiconductor wafer W can be prevented from cracking upon flashlight irradiation.

The gradient α of the tapered surface 95 with respect to the receiving surface 99 must be set to less than 30° so that the end of the semiconductor wafer W can slide with respect to the tapered surface 95 upon such instantaneous thermal expansion. If the gradient α of the tapered surface 95 exceeds 30°, static frictional force between the end of the semiconductor wafer W and the tapered surface 95 is so increased that the end of the semiconductor wafer W in contact with the tapered surface 95 cannot slide upon instantaneous thermal expansion and the semiconductor wafer W may consequently be cracked due to reaction stress received from the tapered surface 95. If the gradient α of the tapered surface 95 is less than 30°, the end of the semiconductor wafer W can slide up with respect to the tapered surface 95 also when the end comes into contact with the tapered surface 95 upon instantaneous thermal expansion of the semiconductor wafer W without constraining the thermal expansion of the semiconductor wafer W. Particularly when the gradient α of the tapered surface 95 is less than 20°, the frictional force between the end of the semiconductor wafer W and the tapered surface 95 is so extremely reduced that the tapered surface 95 applies only small stress to the semiconductor wafer W also when the surface thereof abruptly thermally expands due to flashlight irradiation, whereby the semiconductor wafer W can be more reliably prevented from cracking upon flashlight irradiation.

If the gradient α of the tapered surface 95 with respect to the receiving surface 99 is less than 5°, on the other hand, the aforementioned effect of positioning the semiconductor wafer W with the tapered surface 95 is so hard to attain that the semiconductor wafer W received by the susceptor 73 may run onto the peripheral edge surface 91. Therefore, the gradient α of the tapered surface 95 with respect to the receiving surface 99 must be at least 5°, more preferably at least 10° for attaining a stable effect of positioning the semiconductor wafer W in particular.

The surface property of the tapered surface 95 is also important in order to reduce the frictional force between the end of the semiconductor wafer W and the tapered surface 95 thereby allowing the end to freely slide. In other words, the end of the semiconductor wafer W is readily slidable with respect to the tapered surface 95 if the frictional coefficient between this end and the tapered surface 95 is small. Therefore, the average surface roughness Ra of the tapered surface 95 is set to not more than 1.6 μm for further reducing the frictional force between the end of the semiconductor wafer W and the tapered surface 95 so that the tapered surface 95 applies smaller stress to the semiconductor wafer W also when the surface of the semiconductor wafer W abruptly thermally expands due to flashlight irradiation and the semiconductor wafer W can be further reliably prevented from cracking upon flashlight irradiation. According to this embodiment, the average surface roughness Ra is set to 1.6 μm.

The aforementioned contents of the first embodiment are so epitomized that the tapered surface 95 of the susceptor 73 according to the first embodiment is provided with two functions of positioning the semiconductor wafer W and preventing the semiconductor wafer W from cracking upon flashlight irradiation. In order to reconcile these two functions with each other, the gradient α of the tapered surface 95 with respect to the receiving surface 99 is set to at least 5° and less than 30°. The thermal processing apparatus can position the semiconductor wafer W on the receiving surface 99 through the tapered surface 95 when the susceptor 73 receives the semiconductor wafer W if the gradient α is at least 5°, while the tapered surface 95 is inhibited from applying excess stress to the semiconductor wafer W also when the surface thereof abruptly thermally expands due to flashlight irradiation if the gradient α is less than 30°. In order to more effectively attain these two functions, the gradient α of the tapered surface 95 with respect to the receiving surface 99 is more preferably set to at least 10° and less than 20°. If the average surface roughness Ra of the tapered surface 95 is set to not more than 1.6 μm, the frictional force between the end of the semiconductor wafer W and the tapered surface 95 is further reduced and the tapered surface 95 is more reliably inhibited from applying excess stress to the semiconductor wafer W also when the surface thereof abruptly thermally expands due to flashlight irradiation.

<2. Second Embodiment>

A thermal processing apparatus according to a second embodiment of the present invention is now described. The thermal processing apparatus according to the second embodiment also thermally processes a circular semiconductor wafer W or the like with flashlight from xenon flash lamps, and has an overall structure substantially identical to that of the thermal processing apparatus according to the first embodiment (see FIGS. 1 and 2). The thermal processing apparatus according to the second embodiment is different from that according to the first embodiment in the structure of a susceptor.

Figure 6:
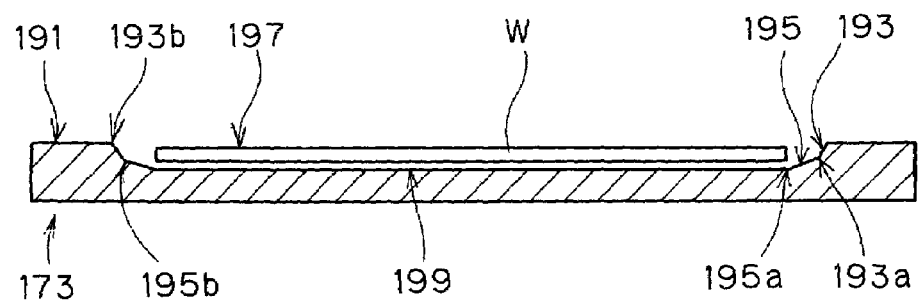
FIG. 6 is a side sectional view of a susceptor of a thermal processing apparatus according to a second embodiment of the present invention.
Figure 7:
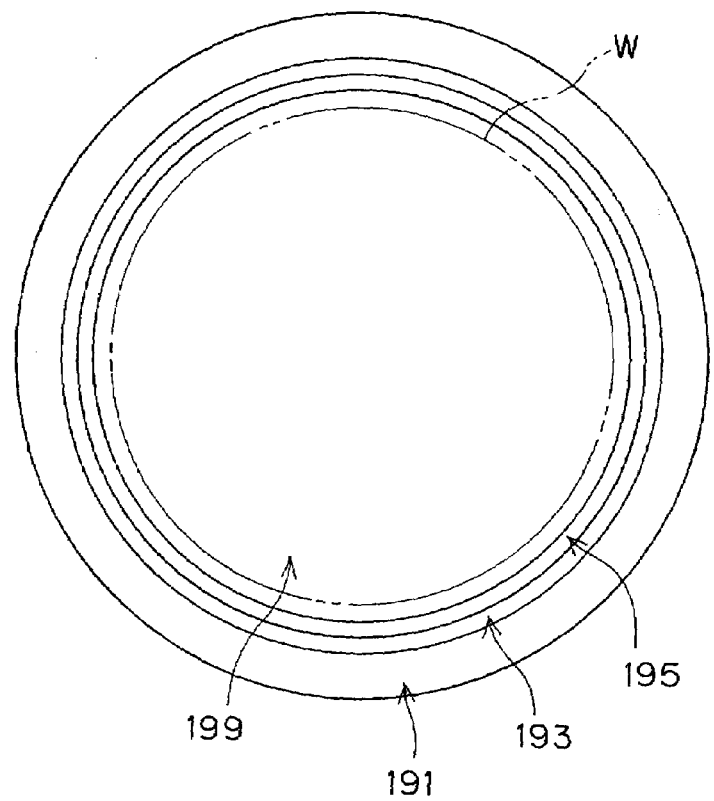
FIG. 7 is a plan view of the susceptor of the thermal processing apparatus according to the second embodiment.

FIGS. 6 and 7 are a side sectional view and a plan view of the susceptor 173 according to the second embodiment respectively. According to the second embodiment, the susceptor 173 is structured by forming a cavity 197 having a circular form as viewed above on a discoidal member. This cavity 197 functions for positioning the semiconductor wafer W and holding the same on the susceptor 173.

The bottom surface of the cavity 197 defines a receiving surface 199 of the susceptor 173. The receiving surface 199 is a circular plane having a diameter slightly larger than that of the semiconductor wafer W, i.e., a region larger than the planar size of the semiconductor wafer W. A first tapered surface 195 is formed to annularly enclose the peripheral edge of the receiving surface 199 defined by the bottom surface of the cavity 197. The first tapered surface 195 has a lower end 195a concatenated to the peripheral edge of the receiving surface 199, and it follows that the first tapered surface 195 specifies the receiving surface 199 in another point of view. The receiving surface 199 may be planar as viewed from the overall susceptor 173, and may be provided with fine irregularities of about several 10 μm, in order to improve temperature distribution uniformity in thermal processing.

A second tapered surface 193 is formed to annularly enclose the peripheral edge of the first tapered surface 195. In other words, the peripheral edge of the cavity 197 defines a double inclined surface with a lower stage of the first tapered surface 195 and an upper stage of the second tapered surface 193. The second tapered surface 193 has a lower end 193a concatenated to the upper end 195b of the first tapered surface 195. A circular opening specified by the upper end 195b of the first tapered surface 195 is parallel to the receiving surface 199, and its diameter is larger than that of the receiving surface 199. In other words, the first tapered surface 195 is formed to upwardly broaden.

On the other hand, the second tapered surface 193 has an upper end 193b concatenated to the peripheral edge surface 191 of the susceptor 173. The peripheral edge surface 191 is an annular plane parallel to the receiving surface 199. The inner diameter of the peripheral edge surface 191 is larger than the diameter of the receiving surface 199. In other words, a circular opening specified by the upper end 193b of the second tapered surface 193 is wider than the receiving surface 199.

Figure 8:
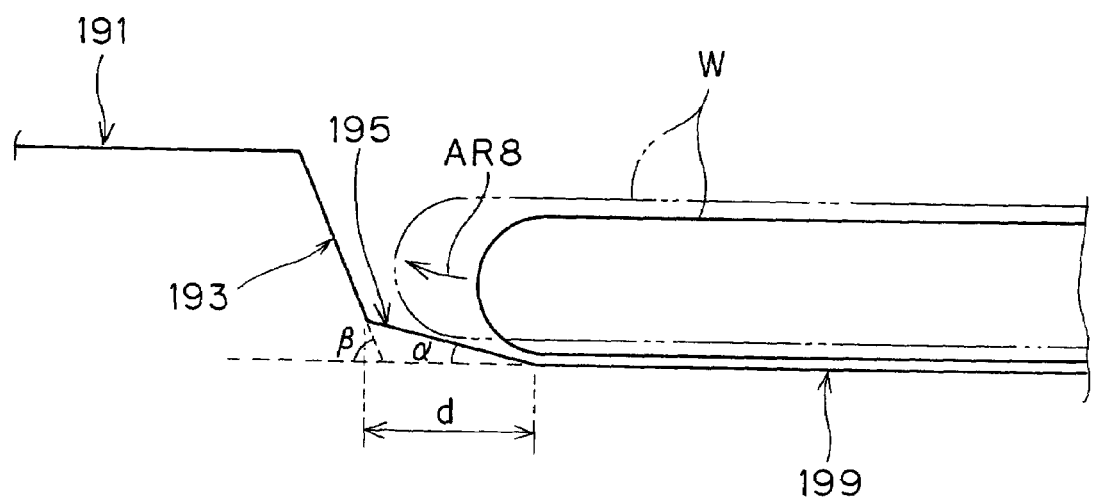
FIG. 8 illustrates the behavior of a semiconductor wafer irradiated with flashlight in the second embodiment.

The gradient α of the first tapered surface 195 defining the lower stage of the double inclined surface for forming the cavity 197 with respect to the receiving surface 199 may be at least 5° and less than 30°, and is set to 15° in this embodiment (see FIG. 8). The average surface roughness Ra of the first tapered surface 195 may be not more than 1.6 μm, and is set to 1.6 μm in the second embodiment. Further, the gradient β of the second tapered surface 193 defining the upper stage of the double inclined surface for forming the cavity 197 with respect to the receiving surface 199 may be larger than the gradient α of the first tapered surface 195, is preferably at least 45° and not more than 90°, and is set to 75° in the second embodiment.

The thermal processing operations of the thermal processing apparatus according to the second embodiment for the semiconductor wafer W are now described. This thermal processing apparatus processes the semiconductor wafer W completely subjected to ion implantation.

Similarly to the first embodiment, the thermal processing apparatus arranges the susceptor 173 and a heating plate 74 on a position for introducing/discharging the semiconductor wafer W into/from a chamber 65 similar to that shown in FIG. 1 so that a transport robot (not shown) introduces the semiconductor wafer W into the chamber 65 through an opening 66 and places the same on support pins 70. When the transport robot completely introduces the semiconductor wafer W into the chamber 65, a gate valve 68 closes the opening 66. Thereafter a motor 40 drives the susceptor 173 and the heating plate 74 for moving up the same to a position for thermally processing the semiconductor wafer W similar to that shown in FIG. 2, for horizontally holding the semiconductor wafer W. The thermal processing apparatus opens on-off valves 80 and 81 for forming a flow of nitrogen gas in the chamber 65.

In the process of upward movement of the susceptor 173 and the heating plate 74, it follows that the susceptor 173 receives the semiconductor wafer W placed on the support pins 70. At this time, a thin air space is defined between the susceptor 173 and the semiconductor wafer W for several seconds after the susceptor 173 receives the semiconductor wafer W from the support pins 70, to slightly float up the semiconductor wafer W from the susceptor 173. In this case, such a phenomenon is repeated for several seconds that the semiconductor wafer W slidingly moves in the cavity 197 due to some cause (e.g., slight inclination) and the first tapered surface 195 springs back an end of the semiconductor wafer W.

Thereafter the aforementioned air space disappears, whereby it follows that the susceptor 173 stably holds the semiconductor wafer W in its cavity 197. In other words, the first tapered surface 195 positions the slightly floating semiconductor wafer W, and it follows that the susceptor 173 holds the semiconductor wafer W on the lowermost position of the cavity 197, i.e., the receiving surface 199 without a specific positioning pin or the like. The diameter of the receiving surface 199 is slightly larger than that of the semiconductor wafer W so that the susceptor 173 eccentrically positions/holds the semiconductor wafer W on the receiving surface 199 in general, and hence it follows that the semiconductor wafer W is stably held while a point of its peripheral edge is in contact with the tapered surface 195. While an end of the semiconductor wafer W may run onto the first tapered surface 195 when the semiconductor wafer W slidingly moves in the cavity 197 depending on the traveling speed, the semiconductor wafer W is prevented from jumping out of the susceptor 173 since the second tapered surface 193 having the steeper gradient β is present outside the first tapered surface 195.

A preheating step and a flash heating step carried out after the susceptor 173 holds the semiconductor wafer W are identical to those in the first embodiment, and hence redundant description is omitted. After completion of the flash heating step, the motor 40 drives the susceptor 173 and the heating plate 74 to the position for introducing/discharging the semiconductor wafer W into/from the chamber 65 similar to that shown in FIG. 1, while the thermal processing apparatus releases the opening 66 having been closed with the gate valve 68. The susceptor 173 moved down with the heating plate 74 transfers the semiconductor wafer W to the support pins 70. The transport robot (not shown) discharges the semiconductor wafer W placed on the support pins 70 from the chamber 65. Thus, the thermal processing apparatus completes a series of thermal processing operations.

In the process of downward movement of the susceptor 173 and the heating plate 74, it follows that the susceptor 173 transfers the held semiconductor wafer W to the support pins 70. At this time, the susceptor 173 may transfer the thermally processed semiconductor wafer W in a state running onto the first tapered surface 195 and causing displacement due to the relatively loose gradient α of the first tapered surface 195 with respect to the receiving surface 199. If the degree of displacement of the semiconductor wafer W is large, the transport robot cannot properly receive the semiconductor wafer W from the support pins 70. According to the second embodiment, the second tapered surface 193 having the steeper gradient β is present outside the first tapered surface 195, whereby the semiconductor wafer W held by the susceptor 173 does not run onto the second tapered surface 193 when the same is transferred to the support pins 70 but can consequently be prevented from remarkable displacement. In other words, the second tapered surface 193 prevents the semiconductor wafer W transferred from the susceptor 173 to the support pins 70 from jumping out of the susceptor 173.

When the thermal processing apparatus lights the flash lamps 69 for heating the semiconductor wafer W, the surface of the semiconductor wafer W abruptly expands due to instantaneous flashlight irradiation to convexly warp the semiconductor wafer W. If an end of the semiconductor wafer W is in contact with a positioning pin or the like at this time, the semiconductor wafer W may be cracked by stress received from the contact position upon instantaneous thermal expansion, as described above.

According to the second embodiment, the gradient α of the first tapered surface 195 with respect to the receiving surface 199 is set to 15°. As hereinabove described, the semiconductor wafer W is generally stably held while a point of its peripheral edge is in contact with the tapered surface 195. When the gradient α of the first tapered surface 195 is less than 30°, the end of the semiconductor wafer W in contact with the tapered surface 195 can slide with respect to the tapered surface 195 also when the semiconductor wafer W instantaneously thermally expands, as shown by arrow AR8 in FIG. 8. In other words, the gradient α of the first tapered surface 195 is set to less than 30° so that the tapered surface 195 does not constrain the end of the semiconductor wafer W, whereby the semiconductor wafer W can freely expand upon lighting of the flash lamps 69. Consequently, the first tapered surface 195 applies no large stress to the semiconductor wafer W also when the surface thereof abruptly thermally expands due to instantaneous flashlight irradiation, whereby the semiconductor wafer W can be prevented from cracking upon flashlight irradiation.

The gradient α of the first tapered surface 195 with respect to the receiving surface 199 must be set to less than 30° so that the end of the semiconductor wafer W can slide with respect to the first tapered surface 195 upon such instantaneous thermal expansion. If the gradient α of the first tapered surface 195 exceeds 30°, static frictional force between the end of the semiconductor wafer W and the first tapered surface 195 is so increased that the end of the semiconductor wafer W in contact with the first tapered surface 195 cannot slide upon instantaneous thermal expansion and the semiconductor wafer W may consequently be cracked due to reaction stress received from the first tapered surface 195. The end of the semiconductor wafer W can slide with respect to the first tapered surface 195 if the gradient α of the first tapered surface 195 is less than 30°, and the frictional force between the end of the semiconductor wafer W and the first tapered surface 195 is so extremely reduced that the first tapered surface 195 applies only small stress to the semiconductor wafer W also when the surface thereof abruptly thermally expands due to flashlight irradiation particularly when the gradient α of the first tapered surface 195 is less than 20°, whereby the semiconductor wafer W can be more reliably prevented from cracking upon flashlight irradiation.

If the gradient α of the first tapered surface 195 with respect to the receiving surface 99 is less than 5°, on the other hand, the aforementioned effect of positioning the semiconductor wafer W with the first tapered surface 195 is so hard to attain that the semiconductor wafer W received by the susceptor 173 may crash into the second tapered surface 193. Therefore, the gradient α of the first tapered surface 195 with respect to the receiving surface 199 must be at least 5°, more preferably at least 10° for attaining a stable effect of positioning the semiconductor wafer W in particular.

The surface property of the first tapered surface 195 is also important in order to reduce the frictional force between the end of the semiconductor wafer W and the first tapered surface 195 thereby allowing the end to freely slide. In other words, the end of the semiconductor wafer W is readily slidable with respect to the first tapered surface 195 if the frictional coefficient between this end and the first tapered surface 195 is small.

Therefore, the average surface roughness Ra of the first tapered surface 195 is preferably set to not more than 1.6 μm for further reducing the frictional force between the end of the semiconductor wafer W and the first tapered surface 195 so that the first tapered surface 195 applies smaller stress to the semiconductor wafer W also when the surface of the semiconductor wafer W abruptly thermally expands due to flashlight irradiation and the semiconductor wafer W can be further reliably prevented from cracking upon flashlight irradiation. According to the second embodiment, therefore, the average surface roughness Ra is set to 1.6 μm.

The contents of the second embodiment are so epitomized that the first tapered surface 195 of the susceptor 173 according to the second embodiment is provided with two functions of positioning the semiconductor wafer W and preventing the semiconductor wafer W from cracking upon flashlight irradiation. In order to reconcile these two functions with each other, the gradient α of the first tapered surface 195 with respect to the receiving surface 199 is set to at least 5° and less than 30°. The thermal processing apparatus can position the semiconductor wafer W on the receiving surface 199 through the first tapered surface 195 when the susceptor 173 receives the semiconductor wafer W if the gradient α is at least 5°, while the first tapered surface 195 is inhibited from applying excess stress to the semiconductor wafer W also when the surface thereof abruptly thermally expands due to flashlight irradiation if the gradient α is less than 30°. In order to more effectively attain these two functions, the gradient α of the first tapered surface 195 with respect to the receiving surface 199 is more preferably set to at least 10° and less than 20°. If the average surface roughness Ra of the first tapered surface 195 is set to not more than 1.6 μm, the frictional force between the end of the semiconductor wafer W and the first tapered surface 195 is further reduced and the first tapered surface 195 is more reliably inhibited from applying excess stress to the semiconductor wafer W also when the surface thereof abruptly thermally expands due to flashlight irradiation.

As hereinabove described, the second tapered surface 193 of the susceptor 173 according to the second embodiment is provided with the function of preventing the semiconductor wafer W from Jumping out of the susceptor 173 when transferred to the support pins 70. The gradient α of the first tapered surface 195 with respect to the receiving surface 199 is relatively loose and hence the semiconductor wafer W may jump out of the susceptor 173 and cause displacement when the susceptor 173 transfers the same to the support pins 70, and the second tapered surface 193 is formed in order to prevent this. In order to prevent the semiconductor wafer W from jumping out of the susceptor 173, the gradient β of the second tapered surface 193 with respect to the receiving surface 199 must be rendered larger than at least the gradient α of the first tapered surface 195 with respect to the receiving surface 199, and is preferably set to at least 45° and not more than 90°. Thus, the semiconductor wafer W which may run onto the first tapered surface 195 due to some cause cannot further run onto the second tapered surface 193, and can be reliably prevented from jumping out of the susceptor 173. Therefore, the gradient β of the second tapered surface 193 with respect to the receiving surface 199 is set to 75° in the second embodiment.

In order to effectively attain the aforementioned effects of the double inclined surface, it is necessary to form the double inclined surface so that the forward end of the peripheral edge of the semiconductor wafer W stably held by the susceptor 173 does not touch the second tapered surface 193 and displacement of the semiconductor wafer W caused when transferred to the support pins 70 is within such a range that the transport robot can receive the semiconductor wafer W from the support pins 70. In order to satisfy such requirements, the length d of the first tapered surface 195 along a direction parallel to the receiving surface 199 must be set to at least 0.1 mm and not more than 5.0 mm. If this length d is less than 0.1 mm, the forward end of a portion of the semiconductor wafer W, stably held by the susceptor 173, in contact with the first tapered surface 195 may also come into contact with the second tapered surface 193 to crack the semiconductor wafer W due to reaction stress upon instantaneous thermal expansion if the length d is larger than 5.0 mm, on the other hand, the transferred semiconductor wafer W may be so excessively displaced that the transport robot cannot receive the same from the support pins 70. Therefore, the length d of the first tapered surface 195 along the direction parallel to the receiving surface 199 must be set to at least 0.1 mm and not more than 5.0 mm, in order to effectively attain the effects of the double inclined surface for preventing the semiconductor wafer W from cracking and jumping out of the susceptor 173.

<3. Modifications>

While the embodiments of the present invention have been described, the present invention is not restricted to the aforementioned examples. While the light source 5 comprises 27 flash lamps 69 in each of the aforementioned embodiments, for example, the present invention is not restricted to this but the number of the flash lamps 69 can alternatively be arbitrarily set.

While the thermal processing apparatus according to each of the aforementioned embodiments fixes the support pins 70 and moves the susceptor 73 or 173 and the heating plate 74 themselves thereby transferring the semiconductor wafer W therebetween, the thermal processing apparatus may alternatively fix the susceptor 73 or 173 and the heating plate 74 and vertically move the support pins 70 thereby transferring the semiconductor wafer W therebetween. In other words, the thermal processing apparatus may be so structured as to relatively vertically move the susceptor 73 or 173 and the heating plate 74 and the support pins 70.

While the thermal processing apparatus according to each of the aforementioned embodiments irradiates the semiconductor wafer W with light for activating ions, the substrate processed by the inventive thermal processing apparatus is not restricted to a semiconductor wafer. The thermal processing apparatus according to the present invention may also process a glass substrate formed with various silicon films such as a silicon nitride film and a polycrystalline silicon film, for example.

While the invention has been shown and described in detail, the foregoing description is in all aspects illustrative and not restrictive. It is therefore understood that numerous modifications and variations can be devised without departing from the scope of the invention.

What is claimed is:

1. A thermal processing susceptor holding a substrate subjected to thermal processing comprising:
   a flat receiving surface having a region larger than the planar size of said substrate for receiving the entirety of said substrate; and
   a tapered surface annularly enclosing the peripheral edge of said receiving surface for specifying said receiving surface, wherein
   the lower end of said tapered surface is concatenated to said peripheral edge of said receiving surface and said tapered surface is formed to upwardly broaden while the gradient of said tapered surface with respect to said receiving surface is at least 5° and less than 30°, and
   the average surface roughness of said tapered surface is not more than 1.6 μm.

2. A thermal processing susceptor holding a substrate subjected to thermal processing, comprising a cavity storing said substrate in thermal processing, wherein
   said cavity has a flat bottom surface for receiving the entirety of said substrate and an inclined surface annularly enclosing the peripheral edge of said bottom surface,
   the gradient of said inclined surface with respect to said bottom surface is at least 5° and less than 30°, and
   the average surface roughness of said inclined surface is not more than 1.6 μm.

3. A thermal processing apparatus irradiating a substrate with flash light thereby heating said substrate, comprising:
   a light source having a plurality of flash lamps;
   a chamber, provided under said light source, comprising a chamber window enabling transmitting flash light emitted from said light source; and
   a holding element substantially horizontally holding said substrate in said chamber, wherein
   said holding element has a thermal processing susceptor comprising:
   a flat receiving surface having a region larger than the planar size of said substrate where flash light from said plurality of flash lamps heats said substrate received on said flat receiving surface, and
   a tapered surface annularly enclosing the peripheral edge of said receiving surface for specifying said receiving surface, and
   the lower end of said tapered surface is concatenated to said peripheral edge of said receiving surface and said tapered surface is formed to upwardly broaden while the gradient of said tapered surface with respect to said receiving surface is at least 5° and less than 30°.

4. The thermal processing apparatus according to claim 3, wherein the average surface roughness of said tapered surface is not more than 1.6 μm.

5. The thermal processing apparatus according to claim 4, wherein
   each of said plurality of flash lamps is a xenon flash lamp, and
   said holding element further has an assistive heater preheating held said substrate.

6. A thermal processing susceptor holding a substrate subjected to thermal processing, comprising:
   a flat receiving surface having a region larger than the planar size of said substrate for receiving the entirety of said substrate;
   a first tapered surface annularly enclosing the peripheral edge of said receiving surface for specifying said receiving surface; and
   a second tapered surface annularly enclosing the peripheral edge of said first tapered surface, wherein
   the lower end of said first tapered surface is concatenated to said peripheral edge of said receiving surface and the lower end of said second tapered surface is concatenated to the upper end of said first tapered surface while said first tapered surface is formed to upwardly broaden, an opening specified by the upper end of said second tapered surface is wider than said receiving surface, the gradient of said second tapered surface with respect to said receiving surface is larger than the gradient of said first tapered surface,
   the gradient of said first tapered surface with respect to said receiving surface is at least 5° and less than 30°, and
   the average surface roughness of said first tapered surface is not more than 1.6 μm.

7. The thermal processing susceptor according to claim 6, wherein
   the gradient of said second tapered surface with respect to said receiving surface is at least 45° and not more than 90°.

8. A thermal processing apparatus irradiating a substrate with flash light thereby heating said substrate, comprising:
   a light source having a plurality of flash lamps;
   a chamber, provided under said light source, comprising a chamber window transmitting flash light emitted from said light source on its upper portion; and
   a holding element substantially horizontally holding said substrate in said chamber, wherein
   said holding element has a thermal processing susceptor comprising:
   a flat receiving surface having a region larger than the planar size of said substrate where flash light from said plurality of flash lamps heats said substrate received on said flat receiving surface, and
   a first tapered surface annularly enclosing the peripheral edge of said receiving surface for specifying said receiving surface, and
   a second tapered surface annularly enclosing the peripheral edge of said first tapered surface, and
   the lower end of said first tapered surface is concatenated to said peripheral edge of said receiving surface and the lower end of said second tapered surface is concatenated to the upper end of said first tapered surface while said first tapered surface is formed to upwardly broaden, an opening specified by the upper end of said second tapered surface is wider than said receiving surface, and the gradient of said second tapered surface with respect to said receiving surface is larger than the gradient of said first tapered surface.

9. The thermal processing apparatus according to claim 8, wherein
   each of said plurality of flash lamps is a xenon flash lamp, and
   said holding element further has an assistive heater preheating held said substrate.

10. A thermal processing apparatus irradiating a substrate with flash light thereby heating said substrate, comprising:
- a light source having a plurality of flash lamps;
- a chamber, provided under said light source, comprising a chamber window transmitting flash light emitted from said light source on its upper portion; and
- a holding element substantially horizontally holding said substrate in said chamber, wherein
- said holding element has a thermal processing susceptor comprising:
- a flat receiving surface having a region larger than the planar size of said substrate where flash light from said plurality of flash lamps heats said substrate received on said flat receiving surface, and
- a tapered surface annularly enclosing the peripheral edge of said receiving surface for specifying said receiving surface, wherein
- the lower end of said tapered surface is concatenated to said peripheral edge of said receiving surface while said tapered surface is formed to upwardly broaden, and
- said tapered surface has such a gradient that an end of said substrate slides up along said tapered surface when said substrate thermally expands while said end is in contact with said tapered surface.

11. The thermal processing apparatus according to claim 10, wherein
- only the surface of said substrate expands and convexly warps when said substrate thermally expands.

12. A thermal processing apparatus irradiating a substrate with flash light thereby heating said substrate, comprising:
- a light source having a plurality of flash lamps;
- a chamber, provided under said light source, comprising a chamber window transmitting flash light emitted from said light source on its upper portion; and
- a holding element substantially horizontally holding said substrate in said chamber, wherein
- said holding element has a thermal processing susceptor comprising:
- a flat receiving surface having a region larger than the planar size of said substrate where flash light from said plurality of flash lamps heats said substrate received on said flat receiving surface, and
- a tapered surface annularly enclosing the peripheral edge of said receiving surface for specifying said receiving surface, wherein
- the lower end of said tapered surface is concatenated to said peripheral edge of said receiving surface while said tapered surface is formed to upwardly broaden, and
- said tapered surface has such a gradient that an end of said substrate slides up along said tapered surface without restricting thermal expansion of said substrate when said substrate received on said receiving surface thermally expands and said end comes into contact with said tapered surface.

13. The thermal processing susceptor according to claim 1, wherein
- said thermal processing susceptor holds a substrate subjected to thermal processing when performing thermal processing with flash light emitted from a flash lamp.

14. The thermal processing susceptor according to claim 2, wherein
- said thermal processing susceptor holds a substrate subjected to thermal processing when performing thermal processing with flash light emitted from a flash lamp.

15. The thermal processing susceptor according to claim 6, wherein
- said thermal processing susceptor holds a substrate subjected to thermal processing when performing thermal processing with flash light emitted from a flash lamp.

16. The thermal processing susceptor according to claim 1, further comprising a flat peripheral edge surface concatenated to an upper end of said tapered surface.

17. The thermal processing susceptor according to claim 2, further comprising a flat peripheral edge surface concatenated to an upper end of said inclined surface.

* * * * *